(12) United States Patent
Li et al.

(10) Patent No.: US 6,958,524 B2
(45) Date of Patent: Oct. 25, 2005

(54) INSULATING LAYER HAVING GRADED DENSIFICATION

(75) Inventors: Lih-Ping Li, Hsin-Chu (TW); Yung-Cheng Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 69 days.

(21) Appl. No.: 10/703,954

(22) Filed: Nov. 6, 2003

(65) Prior Publication Data
US 2005/0101119 A1  May 12, 2005

(51) Int. Cl.⁷ ............... H01L 23/58; H01L 21/4763
(52) U.S. Cl. ............... 257/635; 257/637; 257/642; 257/702; 438/622; 438/623; 438/624; 438/781
(58) Field of Search ............... 438/624, 637, 438/622, 623, 778, 781; 257/632, 635, 637, 257/642, 643, 702

(56) References Cited

U.S. PATENT DOCUMENTS

| | | | |
|---|---|---|---|
| 6,365,506 B1 | 4/2002 | Chang et al. | |
| 6,368,979 B1 | 4/2002 | Wang et al. | |
| 6,372,661 B1 | 4/2002 | Lin et al. | |
| 6,472,306 B1 | 10/2002 | Lee et al. | |
| 6,472,335 B1 | 10/2002 | Tsai et al. | |
| 6,486,059 B2 | 11/2002 | Lee et al. | |
| 6,500,770 B1 | 12/2002 | Cheng et al. | |
| 6,514,881 B1 | 2/2003 | Coffman | |
| 6,525,428 B1 | 2/2003 | Ngo et al. | |
| 6,528,409 B1 | 3/2003 | Lopatin et al. | |
| 6,537,896 B1 | 3/2003 | Catabay et al. | |
| 6,831,370 B2 * | 12/2004 | Farrar | 257/777 |

* cited by examiner

*Primary Examiner*—Hsien-Ming Lee
(74) *Attorney, Agent, or Firm*—Haynes and Boone, LLP

(57) ABSTRACT

A method of manufacturing an insulating layer, including forming a first dielectric layer having a first pore size over a substrate, shrinking the first pore size to a second pore size by a first densification process, forming a second dielectric layer over the first dielectric layer, and increasing an aggregate dielectric constant of the first and second dielectric layers by a second densification process.

22 Claims, 3 Drawing Sheets

INSULATING LAYER HAVING GRADED DENSIFICATION

BACKGROUND OF THE INVENTION

The present disclosure relates generally to integrated circuit insulating layers and, more specifically, to an insulating layer having graded densification, an integrated circuit device incorporating the graded insulating layer, and methods of manufacturing the insulating layer.

Metallization of integrated circuits for micro-electronic devices often employs a process generally termed as damascene by which a substrate is inlayed with metal. More specifically, trench and via openings may be formed in one or more insulating layers, lined with a refractory metal cladding or barrier layer, and filled with a bulk interconnect metal. While copper is often employed as the bulk filling interconnect metal, the low resistance of copper can be negated in devices having feature dimensions less than about 0.1 $\mu$m. That is, the high-resistance silicon nitride or other refractory metal employed as a barrier layer can result in a significant increase of the total RC time delay, thereby degrading device performance.

Low-k dielectric materials can help reduce the RC time delay and parasitic capacitance, although integration of low-k materials into existing fabrication procedures offers many challenges. For example, low-k materials may rely on the encapsulation of air pockets, bubbles or pores, which can result in a low-k material that is brittle and susceptible to cracking. These porous materials usually undergo a high temperature plasma cure or anneal densification process after deposition to increase the dielectric constant (k). However, after the densification process, or after a subsequent etching process, the low-k insulating layer may have rough surfaces where the pores are exposed. These rough surfaces make subsequent processing difficult, and often result in poor adhesion of subsequently deposited layers. Accordingly, layers formed on or over the low-k insulating layers are susceptible to cracking and peeling, which can increase the dielectric constant of the insulating layers (once again increasing the RC delay) and decrease the conductivity of interconnects formed therein.

Moreover, the high temperature plasma anneal or curing can form a gradient porous layer where pores may be concentrated at the bottom of the insulating layer. Such a gradient porosity can provide weak mechanical stability. As device geometries approach 90 nm and smaller, developing technology includes forming damascene trenches in an insulating layer without employing an etch stop layer, such as by employing a timed etch. However, because the timed etch forms a trench bottom near or within the accumulation of pores near the bottom of the insulating layer, achieving a uniform trench depth profile is difficult, if not impossible, such that the resulting trenches may have rough and jagged bottom surfaces. Again, such rough surfaces do not encourage adequate adhesion of subsequently formed interconnects and other layers, thereby rendering the entire stack of layers susceptible to delaminating, a serious risk to device yield, reliability and performance.

Accordingly, what is needed in the art is an insulating layer and method of manufacture therefore that addresses the problems discussed above.

SUMMARY OF THE INVENTION

To address the above-discussed deficiencies of the prior art, the present disclosure provides a method of manufacturing a dielectric layer, including forming a first dielectric layer having a first pore size over a substrate and shrinking the first pore size to a second pore size by a first densification process. A second dielectric layer is formed over the first dielectric layer, and an aggregate dielectric constant of the first and second dielectric layers is increased by a second densification process.

The present disclosure also provides a method of manufacturing an integrated circuit device. In one embodiment, the method includes forming a first dielectric layer having a first pore size over a substrate having micro-electronic devices located therein. The first pore size is then shrunk to a second pore size by a first densification process. A second dielectric layer is formed over the first dielectric layer. Thereafter, a second densification process increases an aggregate dielectric constant of the first and second dielectric layers. A plurality of interconnects are then formed in the first and second dielectric layers to interconnect ones of the micro-electronic devices.

In another embodiment, a method of manufacturing an integrated circuit device according to aspects of the present disclosure includes forming a plurality of overlying dielectric layers over a substrate, the substrate including a plurality of micro-electronic devices located therein. A first pore size of at least one of the plurality of dielectric layers is shrunk to a second pore size by a densification process prior to forming other overlying ones of the plurality of dielectric layers. The method also includes increasing an aggregate dielectric constant of at least one of the plurality of dielectric layers by a second densification process. A plurality of interconnects are then formed in ones of the plurality of dielectric layers to interconnect ones of the micro-electronic devices.

The present disclosure further provides an integrated circuit device. In one embodiment, the devices includes a substrate having micro-electronic devices located therein, a first dielectric layer having a first pore size located over the substrate, and a second dielectric layer having a second pore size over the first dielectric layer, wherein the second pore size is larger than the first pore size. The integrated circuit device also includes interconnects located in the first and second dielectric layers to interconnect ones of the micro-electronic devices.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings.

DETAILED DESCRIPTION

Figure 1:
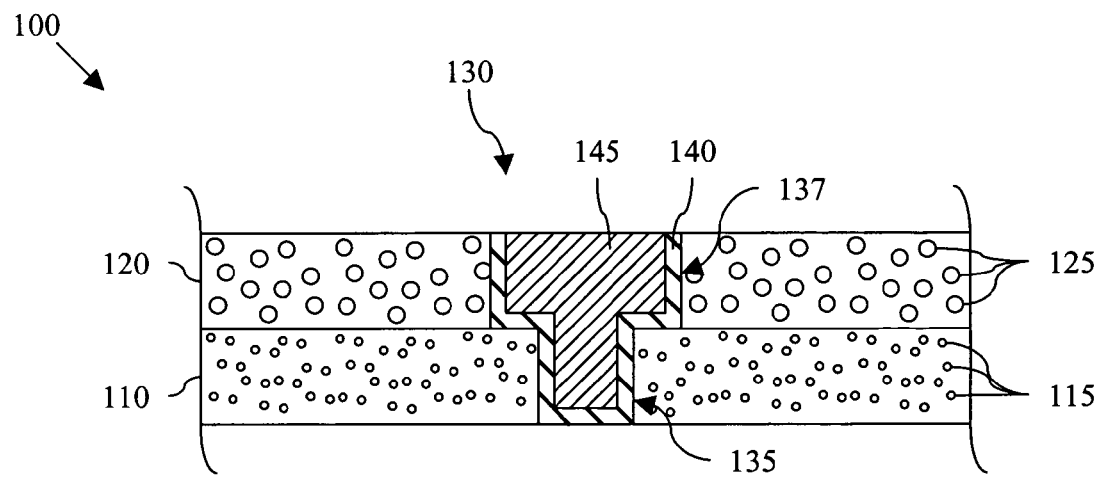
FIG. 1 illustrates a sectional view of one embodiment of a graded insulating layer constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of an insulating layer 100 constructed according to aspects of the present disclosure. The insulating layer 100 includes a first dielectric portion or layer 110 and a second dielectric portion or layer 120. The first and second dielectric layers 110, 120 may be formed by chemical vapor deposition (CVD), atomic layer deposition (ALD), plasma enhanced CVD (PECVD), physical vapor deposition (PVD) or other processes, and may comprise $SiO_2$, TEOS, PSG, BPSG, FSG or other materials. In one embodiment, the first and second dielectric layers 110, 120 comprise TOM-CATS™ or MesoELK™, products distributed by Schumacher of Carlsbad, Calif. The first and second dielectric layers 110, 120 may also be formed in-situ.

In some embodiments in which the first and/or second dielectric layers 110, 120 are formed by CVD, PECVD, spin-on coating or ALD, the formation process may include the introduction of an organosilicate precursor, such as MesoELK™. Typically, such a process includes introducing oxygen, ozone and/or inert gases such as $N_2$, $H_2$ and Ar into the deposition environment to provide a porous film having gas-filled pores. Such a process may provide lower dielectric constant values than other processes. In embodiments in which oxygen, ozone and/or inert gases are employed to deposit the first and/or second dielectric layers 110, 120, the concentration and flow of the oxygen or ozone into the process environment may be precisely controlled to achieve the desired pore size for the particular application.

As shown in FIG. 1, the first dielectric layer 110 may include a dispersion of small pores 115 and the second dielectric layer 120 may include a dispersion of large pores 125. For example, the small pores 115 may be at least about 25% smaller in diameter than the large pores 125. The number of small pores 115 per unit volume may be substantially similar to the number of large pores 125 per unit volume, although other ratios are within the scope of the present disclosure. The pores 115 in the first dielectric layer 110 may be smaller than the pores 125 in the second dielectric layer 120 as a result of a densification process performed on the first dielectric layer 110 prior to forming the second dielectric layer 120.

In a preferred embodiment, the densification process is a low-temperature process. For example, the densification process may be a low temperature anneal, possibly to a maximum temperature ranging between about 20° C. and about 350° C. In another embodiment, the densification process may be a low-temperature plasma treatment, such as one employing argon, ozone or a process chemistry employed in the formation of the first dielectric layer 110. The densification process may also be an in-situ process. For example, the densification process and the formation of the first dielectric layer 110 may be performed in a single process chamber or cluster tool.

The second dielectric layer 120 may also undergo a densification process which may be similar to the densification process performed on the first dielectric layer 110. However, in one embodiment, the densification process performed on the second dielectric layer 120 may be a high temperature process, such as a plasma cure at a temperature above about 350° C. In general, the densification process performed after the second dielectric layer 120 is formed may be selected to decrease the dielectric constant of the first and/or second dielectric layers 110, 120 to a desired level, such as to below about 2.2. In a preferred embodiment, more than one densification process may be performed during the fabrication of the insulating layer 100. For example, a first, low-temperature densification process may be performed between the deposition of the first and second dielectric layers 110, 120 to decrease the size of the pores 115 formed in the first dielectric layer 110, and a second, higher-temperature densification process may be performed after the second dielectric layer 120 is formed over the first dielectric layer 110 to achieve a desired dielectric constant of the graded insulating layer 100. The second densification process may also be an in-situ process. For example, the first and/or second densification processes and the formation of the first and/or second dielectric layers 110, 120 may be performed in a single process chamber or cluster tool.

FIG. 1 also illustrates that an interconnect member 130 may be formed in the dielectric layers 110, 120. The interconnect member 130 may include a via portion 135 and a trench portion 137. The interconnect member 130 may be formed by etching or otherwise creating openings in the first and second dielectric layers 110, 120, lining the openings with a barrier layer 140 and filling the lined openings with a bulk conductive material 145. The openings may be formed by conventional or future-developed processes, such as plasma or dry etching, possibly employing a mask comprising photoresist or other materials. The barrier layer 140 may comprise Ti, Ta, TiW, TiN, TaN, SiOC, SiC or other materials, and may be formed by CVD, ionized metal plasma (IMP) deposition, metal-organic CVD (MOCVD), PECVD, ALD, PVD, combinations thereof or other methods. The bulk conductive material 145 may comprise Al, Cu or other materials typically employed as interconnect conductors, and may be deposited by ALD, CVD, PVD, sputtering, electroplating or other methods.

As device geometries continue to shrink, the control of the profile of low-k dielectric layers becomes increasingly important to reduce parasitic capacitance. As discussed above, etch profiles of low-k dielectrics can exhibit rough and uneven surfaces, especially at etch end points and at interfaces between layers. Rough and uneven surfaces can be attributed to non-uniform pore size and dispersion, or merely due to the occurrence of relatively large pores near surfaces or interfaces. However, by submitting the first dielectric layer 110 to a densification process according to aspects of the present disclosure prior to forming the second dielectric layer 120, the size of the pores 115 may be smaller compared to the size of the pores 125. The densification process may also improve the uniformity of the dispersion of the pores 115. Consequently, the uniformity of the bottom of the trench portion 137 of the interconnect 130 (at its interface with the first dielectric layer 110) may be more uniform or have a more uniform profile. Therefore, the adhesion of the interconnect 130 to the first dielectric layer 110 may be improved, enhancing the performance of the device into which the insulating layer 100 is incorporated.

Figure 2:
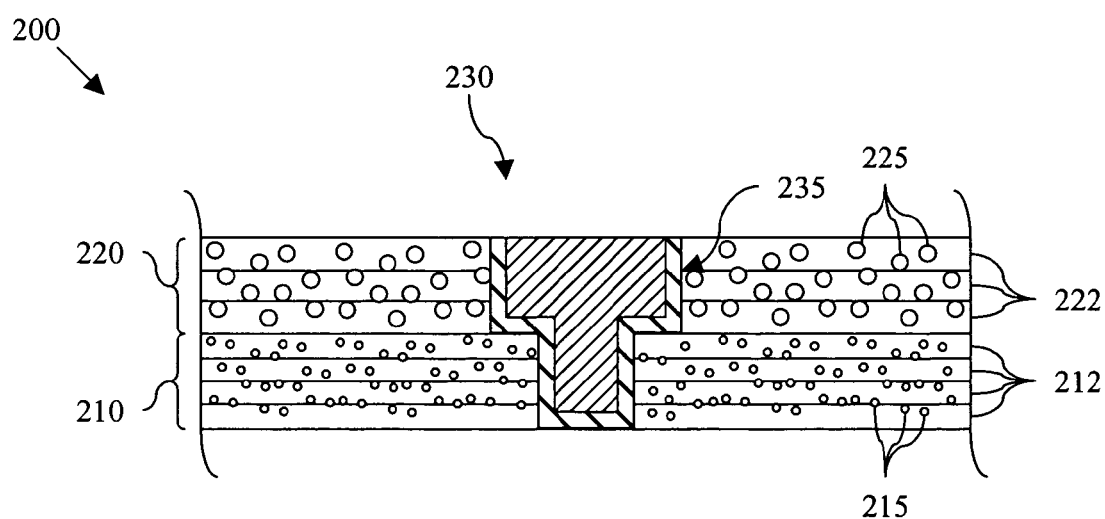
FIG. 2 illustrates a sectional view of another embodiment of a graded insulating layer constructed according to aspects of the present disclosure.

Referring to FIG. 2, illustrated is a sectional view of another embodiment of an insulating layer 200 constructed according to aspects of the present disclosure. The insulating layer 200 may be substantially similar to the insulating layer 100 shown in FIG. 1. For example, the insulating layer 200 includes first and second dielectric layers 210, 220 having pores 215, 225 of varying sizes or densities and an interconnect member 230 formed therein. However, multiple deposition and densification processes may be employed to form each of the first and second dielectric layers 210, 220. For example, in the illustrated embodiment, the first dielectric layer 210 includes four first thin-film elements 212 and the second dielectric layer 220 includes three second thin-film elements 222. Of course, the present disclosure does not limit the first and second dielectric layers 210, 220 to any particular number of thin film elements 212, 222. In general, the thin-film elements 212, 222 may be serially formed until desired thicknesses for the first and second dielectric layers 210, 220 are achieved.

Except possibly for their thicknesses, the first thin-film elements 212 may similar in composition and manufacture to the first dielectric layer 110 shown in FIG. 1. For example, each of the first thin-film elements 212 may be deposited and undergo a densification process prior to the fabrication of other overlying first thin-film elements 212 or other layers, wherein the densification process may be similar to the low-temperature densification process described above with respect to the first dielectric layer 110 shown in FIG. 1. Similarly, the second thin-film elements 222 may be similar to the second dielectric layer 120 shown in FIG. 1, except possibly for their thicknesses. Accordingly, each of the second thin-film elements 222 may be deposited and undergo a densification process prior to the fabrication of other overlying second thin-film elements 222 or other layers, wherein the densification process may be similar to the higher-temperature densification process described above with respect to the second dielectric layer 120 shown in FIG. 1. By forming the first and second dielectric layers 210, 220 by iteratively depositing and densifying thin-film elements, the thicknesses of the dielectric layers 210, 220 may be precisely controlled, as well as the graded nature of the size of the pores 215, 225, such that the transition between pore sizes may be located at a desired position, possibly in relation to the bottom of a trench portion 235 of the interconnect 230.

Figure 3:
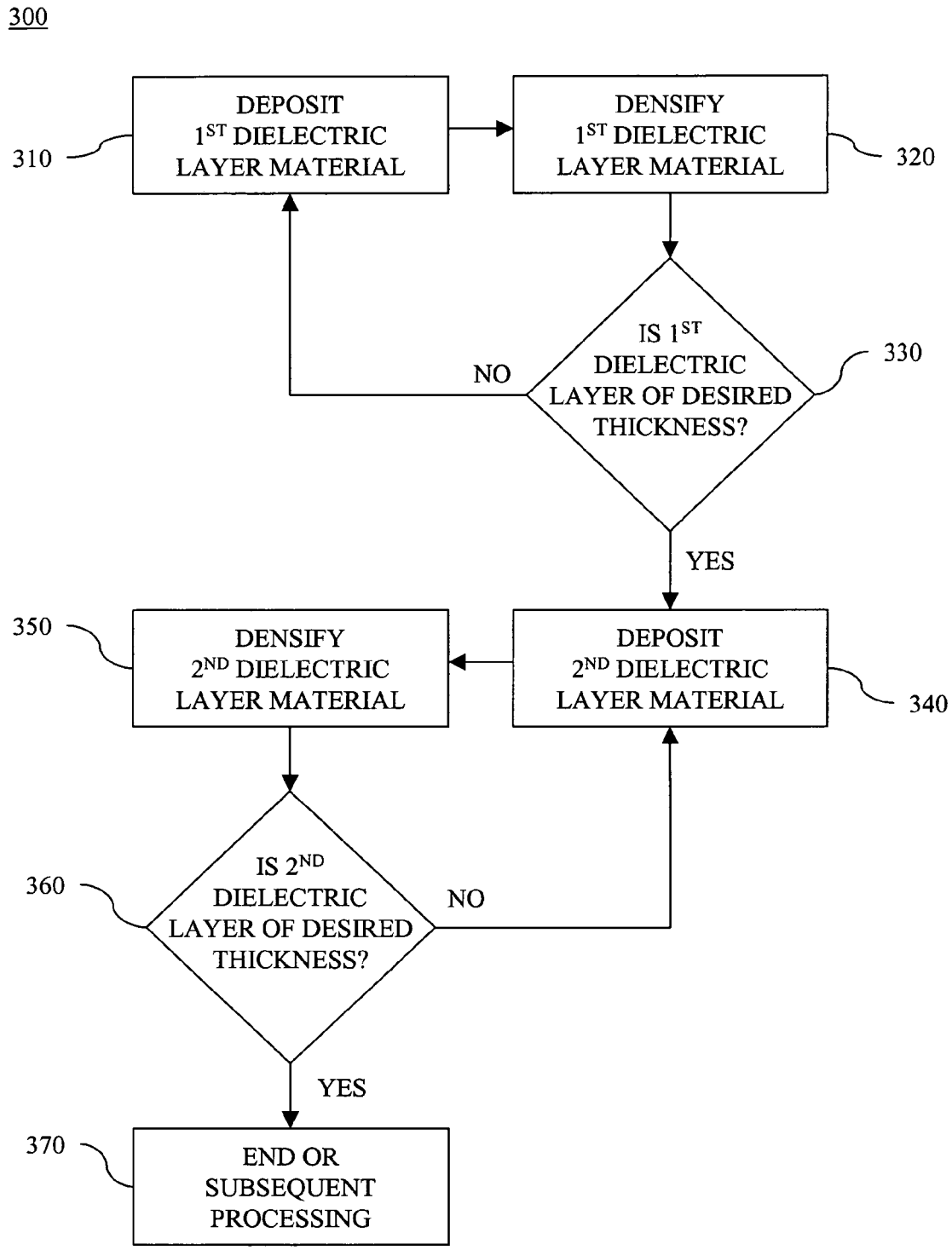
FIG. 3 illustrates a block diagram of one embodiment of a method of manufacturing an insulating layer according to aspects of the present disclosure.

Referring now to FIG. 3. is a block diagram of one embodiment of a method 300 of manufacturing an insulating layer according to aspects of the present disclosure. The method 300 may be one method by which the insulating layer 100 of FIG. 1 and/or the insulating layer 200 of FIG. 2 may be fabricated. The method 300 begins with the deposition of a first dielectric layer material in a step 310. The first dielectric layer material may be similar in composition and manufacture to the first dielectric layers 110, 210 of FIGS. 1 and 2, respectively. The first dielectric layer material may then undergo a densification process in a next step 320. The densification process in the step 320 may be a low-temperature process, such as those described above with respect to the densification of the first dielectric layer 110 of FIG. 1.

In a subsequent decisional step 330, the thickness of the first dielectric layer material deposited in the step 310 is compared to a desired thickness. If the desired thickness has been achieved, the method 300 continues to a subsequent step 340. However, if the desired thickness has not been achieved, the method returns to the step 310 to repeat the deposition and densification processes of steps 310 and 320 until the step 330 detects that the deposited thickness of the first dielectric layer material equals the desired thickness. In embodiments in which the deposition process(es) of the step 310 is performed more than once to achieve the desired thickness, the densification process of the step 320 may not be performed on each successive deposition of the first dielectric material. For example, the densification process may be performed on alternating ones of the individual first dielectric layer material depositions, or may be performed only once after the entire thickness of the first dielectric layer has been achieved.

In the step 340, a second dielectric layer material is deposited. The second dielectric layer material may be similar in composition and manufacture to the second dielectric layers 120, 220 of FIGS. 1 and 2, respectively. The second dielectric layer material may then undergo a densification process in a next step 350. The densification process in the step 350 may be a higher-temperature process, such as those described above with respect to the densification of the second dielectric layer 120 of FIG. 1.

In a subsequent decisional step 360, the thickness of the second dielectric layer material deposited in the step 340 is compared to a desired thickness. If the desired thickness has been achieved, the method 300 continues to a subsequent step 370, which may be an ending step in the method 300 or may include additional conventional processing not further discussed herein for the purposes of clarity and brevity. However, if the decisional step 360 determines that the desired thickness has not been achieved, the method returns to the step 340 to repeat the deposition and densification processes of steps 340 and 350 until the step 360 detects that the deposited thickness of the second dielectric layer material equals the desired thickness. In embodiments in which the deposition process(es) of the step 340 is performed more than once to achieve the desired thickness, the densification process of the step 350 may not performed on each successive deposition of the second dielectric material. For example, the densification process may be performed on alternating ones of the individual second dielectric layer material deposition, or may be performed only once after the entire thickness of the second dielectric layer has been achieved.

Figure 4:
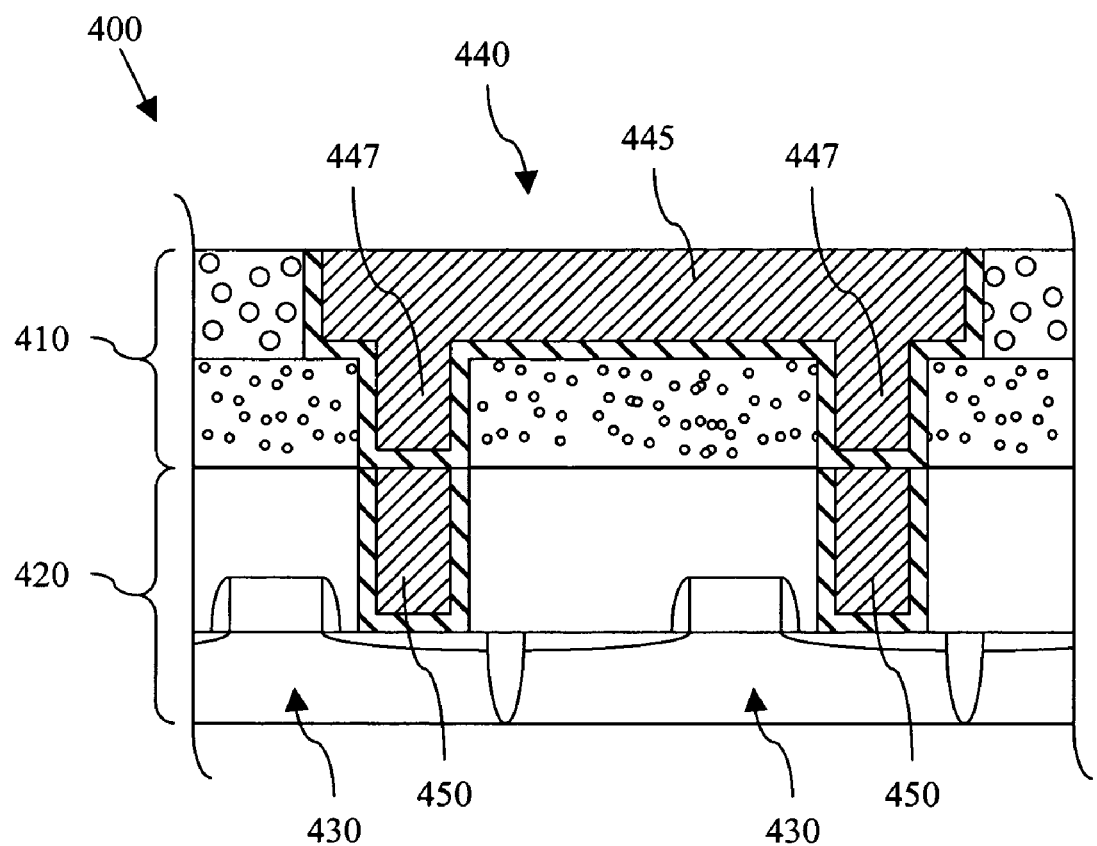
FIG. 4 illustrates a sectional view of one embodiment of an integrated circuit device constructed according to aspects of the present disclosure.

Referring to FIG. 4, illustrated is a sectional view of one embodiment of an integrated circuit device 400 constructed according to aspects of the present disclosure. The device 400 is one environment in which the insulating layers 100, 200 of FIGS. 1 and 2, respectively, may be implemented. For example, the device 400 includes an insulating layer 410 that may be substantially similar in composition and manufacture to the insulating layer 100 shown in FIG. 1 or the insulating layer 200 shown in FIG. 2.

The device 400 also includes a substrate 420 over which the insulating layer 410 is formed. The substrate 420 may be a conventional semiconductor substrate, such as those typically employed in the manufacture of integrated circuit semiconductor devices. The substrate 420 may include one or more micro-electronic devices 430. For example, as in the illustrated embodiment, the micro-electronic devices 430 may be complimentary metal-oxide-semiconductor (CMOS) devices.

The device 400 also includes one or more interconnects 440 located in the insulating layer 410 and coupling ones of the micro-electronic devices 430. In the illustrated embodiment, the interconnect 440 is a dual-damascene interconnect having a trench portion 445 and via portions 447. The interconnects 440 may be similar in composition and manufacture to the interconnect 130 shown in FIG. 1. Of course, the scope of the present disclosure does not limited the interconnects 440 to dual-damascene structures, such that single-damascene or other structures may also be employed as the interconnects 440. The interconnects 440 or the substrate 420 may also include standard or borderless contact via portions 450 contributing to the interconnection of the micro-electronic devices 430, as shown in FIG. 4.

Although embodiments of the present disclosure have been described in detail, those skilled in the art should understand that they can make various changes, substitutions and alterations herein without departing from the spirit and scope of the present disclosure.

What is claimed is:

1. A method of manufacturing an insulating layer, comprising:
    forming a first dielectric layer having a first pore size over a substrate;
    shrinking the first pore size to a second pore size by a first densification process;
    forming a second dielectric layer over the first dielectric layer; and
    increasing an aggregate dielectric constant of the first and second dielectric layers by a second densification process.

2. The method of claim 1 wherein the first densification process comprises annealing the first dielectric layer.

3. The method of claim 2 wherein the first dielectric layer is annealed at a temperature ranging between about 20° C. and about 350° C.

4. The method of claim 1 wherein the first densification process comprises plasma curing the first dielectric layer.

5. The method of claim 1 wherein the first and second dielectric layers each comprise a material selected from the group consisting of:
    $SiO_2$;
    TEOS;
    PSG;
    BPSG; and
    FSG.

6. The method of claim 1 wherein the first and second dielectric layers are formed by a process selected from the group consisting of:
    CVD;
    PECVD;
    ALD; and
    PVD.

7. The method of claim 1 wherein the first and second densification processes are in-situ to forming the first and second dielectric layers.

8. The method of claim 1 wherein the second densification process comprises annealing at least the second dielectric layer.

9. The method of claim 8 wherein the second dielectric layer is annealed at a temperature above about 350° C.

10. The method of claim 1 wherein the second densification process comprises plasma curing the second dielectric layer.

11. A method of manufacturing an integrated circuit device, comprising:
    forming a first dielectric layer having a first pore size over a substrate having a plurality of micro-electronic devices located therein;
    shrinking the first pore size to a second pore size by a first densification process;
    forming a second dielectric layer over the first dielectric layer;
    increasing an aggregate dielectric constant of the first and second dielectric layers by a second densification process; and
    forming a plurality of interconnects in the first and second dielectric layers to interconnect ones of the plurality of micro-electronic devices.

12. The method of claim 11 wherein the first densification process comprises annealing the first dielectric layer.

13. The method of claim 12 wherein the first dielectric layer is annealed at a temperature ranging between about 20° C. and about 350° C.

14. The method of claim 11 wherein the first densification process comprises plasma curing the first dielectric layer.

15. The method of claim 11 wherein at least one of the plurality of interconnects is a dual-damascene structure having a via portion extending through the first dielectric layer and a trench portion located in the second dielectric layer.

16. An integrated circuit device, comprising:
    a substrate having a plurality of micro-electronic devices located therein;
    a first dielectric layer having a first pore size located over the substrate;
    a second dielectric layer having a second pore size located over the first dielectric layer, wherein the second pore size is larger than the first pore size; and
    interconnects located in the first and second dielectric layers and interconnecting ones of the plurality of micro-electronic devices.

17. The device of claim 16 wherein at least one of the plurality of interconnects is a dual-damascene structure having a via portion extending through the first dielectric layer and a trench portion located in the second dielectric layer.

18. A method of manufacturing an integrated circuit device, comprising:
    forming a plurality of overlying dielectric layers over a substrate, the substrate including a plurality of micro-electronic devices located therein;
    shrinking a first pore size of at least one of the plurality of overlying dielectric layers to a second pore size by a densification process prior to forming other overlying ones of the plurality of overlying dielectric layers;
    increasing an aggregate dielectric constant of at least one of the plurality of overlying dielectric layers by a second densification process; and forming a plurality of interconnects in ones of the plurality of overlying dielectric layers to interconnect ones of the micro-electronic devices.

19. The method of claim 18 wherein the first densification process comprises annealing the at least one overlying dielectric layer.

20. The method of claim 19 wherein the annealing is at a temperature ranging between about 20° C. and about 350° C.

21. The method of claim 18 wherein the first densification process comprises plasma curing the at least one overlying dielectric layer.

22. The method of claim 18 wherein at least one of the plurality of interconnects is a dual-damascene structure.

* * * * *